United States Patent [19]
Fierkens

[11] Patent Number: 5,578,871
[45] Date of Patent: Nov. 26, 1996

[54] INTEGRATED CIRCUIT PACKAGE AND METHOD OF MAKING THE SAME

[76] Inventor: Richard H. J. Fierkens, Keurbeek 15, 6914 AE, Herwen, Netherlands

[21] Appl. No.: 324,717

[22] Filed: Oct. 18, 1994

[51] Int. Cl.⁶ .................................................. H01L 23/495
[52] U.S. Cl. .............................. 257/676; 257/787
[58] Field of Search .................................. 257/787, 667, 257/673

[56] References Cited

U.S. PATENT DOCUMENTS

| | | | |
|---|---|---|---|
| 4,803,540 | 2/1989 | Moyer et al. | 257/676 |
| 5,389,739 | 2/1995 | Mills | 174/52.4 |

FOREIGN PATENT DOCUMENTS

| | | | |
|---|---|---|---|
| 2-117162 | 5/1990 | Japan | 257/787 |
| 5-47979 | 2/1993 | Japan | 257/787 |

OTHER PUBLICATIONS

Licari, J. J.; "Plastic Coatings for Electronics", pp. 14–23, and 278–313, 1971.

*Primary Examiner*—Jerome Jackson, Jr.
*Assistant Examiner*—John Guay
*Attorney, Agent, or Firm*—Harry M. Weiss; Jeffrey D. Moy; Harry M. Weiss & Associates, P.C.

[57] ABSTRACT

A leadframe strip is provided with a die pad and a protrusion is formed on the die pad so as to project from the rear side thereof. An integrated circuit chip is bonded to the front side of the die pad and is connected by leads to portions of the leadframe strip adjacent the die pad. The die pad, chip and leads are placed in a mold and an epoxy is injected into the mold to encapsulate the die pad, chip and leads. The protrusion spaces the die pad from the internal mold surface confronting the rear side of the die pad.

3 Claims, 1 Drawing Sheet

5,578,871

INTEGRATED CIRCUIT PACKAGE AND METHOD OF MAKING THE SAME

BACKGROUND OF THE INVENTION

1. Field of the Invention

The invention relates to an integrated circuit package.

2. Description of the Related Art

In the manufacture of an integrated circuit package, a leadframe strip or substrate is formed to produce a die pad. The die pad constitutes a mounting location for an integrated circuit chip which is adhesively secured to the die pad and is connected to the leadframe strip by wires. The portions of the leadframe strip adjacent either side of the die pad, together with the die pad, chip and wires, are then placed in a mold where they are encapsulated in an epoxy.

The semiconductor industry experiences severe problems with the encapsulation process. Thus, it is very difficult to keep the die pad and the chip in the middle of the mold. The die pad and the chip tend to move so that the rear surface of the die pad, which faces away from the chip, comes into contact with the adjoining mold surface. Consequently, the rear surface of the die pad is not covered by epoxy. Moreover, the movement of the die pad and the chip cause the leadframe strip to bend.

SUMMARY OF THE INVENTION

It is an object of the invention to allow virtually complete encapsulation of a chip mounting location with little or no problem.

Another object of the invention is to avoid significant bending of a chip substrate during encapsulation of a chip mounting location.

The preceding objects, as well as others which will become apparent as the description proceeds, are achieved by the invention.

One aspect of the invention resides in a mount for an integrated circuit chip. The mount comprises a substrate having a mounting location for the chip. The mounting location has a first or front side for attachment of the chip and a second or rear side facing away from the front side. The mounting location is provided with a protrusion which projects from the rear side of the mounting location.

The protrusion acts as a spacer which holds the mounting location at a distance from a mold surface facing the rear side of the mounting location. Accordingly, virtually the entire rear side of the mounting location is now accessible for encapsulation. The protrusion further acts as a stop to prevent movement which can lead to undesired bending of the substrate.

Another aspect of the invention resides in a method of making an integrated circuit package. The method comprises the step of providing a substrate having a mounting location for an integrated circuit chip. The mounting location has a first or front side for attachment of the chip and a second or rear side facing away from the front side. The method additionally comprises the step of forming a protrusion which projects from the rear side of the mounting location.

The substrate may be essentially flat so as to define a plane. In such an event, the method can also comprise the step of bending the mounting location out of the plane so that the front side of the mounting location faces the plane.

The forming step can be carried out in such a manner that the protrusion is essentially centered with respect to the mounting location. Moreover, the forming step may involve dimpling the substrate.

The method can further comprise the step of securing a selected integrated circuit chip to the front side of the mounting location. This may be followed by the step of encapsulating the mounting location and the chip. The encapsulating step can be performed using plastic, preferably an epoxy. The encapsulating step may include confining the mounting location and the chip in an enclosure having an external peripheral surface, and spacing the rear side of the mounting location from the peripheral surface using the protrusion.

Additional features and advantages of the invention will become apparent from the following detailed description of preferred embodiments when read in conjunction with the accompanying drawings.

DESCRIPTION OF THE PREFERRED EMBODIMENTS

Figure 1:
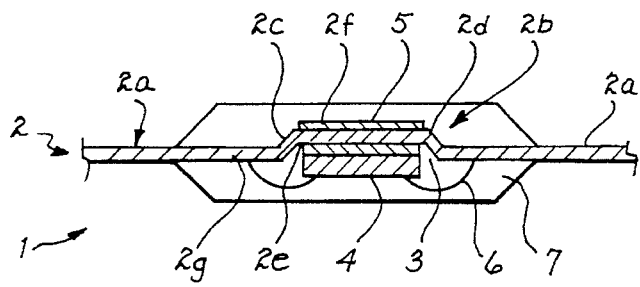
FIG. 1 is a fragmentary longitudinal sectional view of a good prior art integrated circuit package.

Referring to FIG. 1, the numeral 1 generally denotes an integrated circuit package in accordance with the prior art. The package 1 includes a leadframe strip or substrate 2 having flat portions 2a which are located in a predetermined plane. The leadframe strip 2 further has another portion 2b which is bent out of the plane of the flat portions 2a so as to define a recess or concavity 3.

Figure 2:
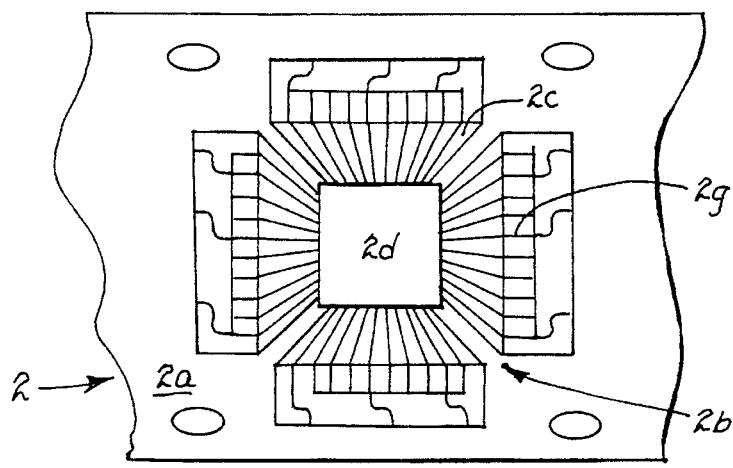
FIG. 2 is a fragmentary plan view of a mounting location constituting part of the integrated circuit of FIG. 1.

With reference also to FIG. 2, the bent out portion 2b of the leadframe strip 2 has four side walls 2c which are inclined to the flat portions 2a of the leadframe strip 2 and an end wall 2d which is generally parallel to the flat portions 2a. The side walls 2c connect the end wall 2d with the flat portions 2a of the leadframe strip 2. The side walls 2c and end wall 2d bound the recess 3 on all sides except for that side of the recess 3 which is located opposite the end wall 2d and is open.

The end wall 2d has a front side 2e which faces the plane of the flat portions 2a of the leadframe strip 2 and a rear side 2f which faces away from this plane. The end wall 2d constitutes a die pad or mounting location, and an integrated circuit chip 4 is mounted on the front side 2e of the die pad 2d. The chip 4 is secured to the die pad 2d by a layer of adhesive 5. The chip 4 is accommodated in the recess 3 and is connected to the flat portions 2a of the leadframe strip 2 by wires or leads 6.

The flat portions 2a of the leadframe strip 2 have segments 2g which are located adjacent the bent out portion 2b of the leadframe strip 2. The segments 2g, bent out portion 2b, chip 4, and wires 6 are encapsulated in an enclosure 7 composed of plastic, preferably an epoxy. The bent out portion 2b, chip 4 and wires 6 are completely surrounded by the enclosure 7 so that the package 1 constitutes a good integrated circuit package.

To make the integrated circuit package 1, the initially flat leadframe strip 2 is formed to produce the bent out portion 2b with the die pad 2d. The chip 4 is inserted in the recess 3 through the open side of the latter and adhesively secured to the front side 2e of the die pad 2d. The chip 4 is then connected to the flat portions 2a of the leadframe strip 2 via the wires 6.

Once the chip 4 has been attached to the die pad 2d and wired to the flat portions 2a of the leadframe strip 2, the bent out portion 2b, chip 4 and wires 6, together with the flat leadframe segments 2g adjacent the bent out portion 2b, are placed in a mold. The mold is closed and an epoxy in flowable condition is injected into the mold to encapsulate the segments 2g, bent out portion 2b, chip 4 and wires 6. After the epoxy has set to form the enclosure 7, the mold is opened to remove the enclosure 7 with the encapsulated segments 2g, bent out portion 2b, chip 4 and wires 6.

The bent out portion 2b is positioned in the mold so that the chip 4, the wires 6 and the rear side 2f of the bent out portion 2b are spaced from the internal mold surfaces. This is intended to allow the injected epoxy to completely surround the bent out portion 2b, chip 4 and wires 6. In practice, however, it is extremely difficult to hold the bent out portion 2b in the desired position during molding. The bent out portion 2b tends to shift in a direction such that the rear side 2f of the bent out portion 2b comes into contact with the internal mold surface which faces the rear side 2f.

Figure 3:
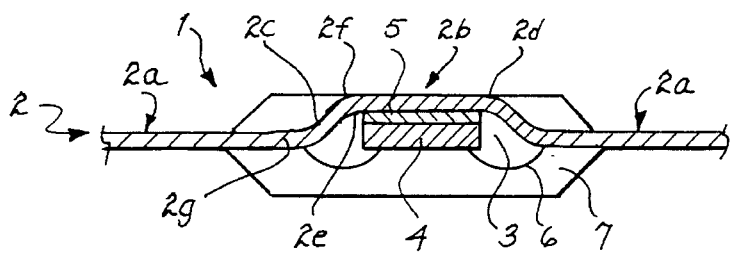
FIG. 3 is a view similar to FIG. 1 of a bad prior art integrated circuit package.

FIG. 3, in which the same reference numerals as in FIG. 1 are used to identify like elements, shows the results of shifting of the bent out portion 2b. No epoxy layer has formed on the rear side 2f of the bent out portion 2b and the rear side 2f is exposed. Furthermore, the side walls 2c and end wall 2d of the bent out portion 2b, as well as the flat leadframe segments 2g adjacent the bent out portion 2b, have undergone bending and are deformed.

Figure 4:
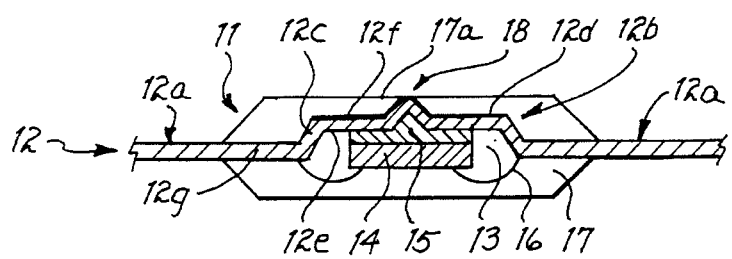
FIG. 4 is a view similar to FIG. 1 of an integrated circuit package according to the invention.

An integrated circuit package 11 according to the invention is illustrated in FIG. 4 where the same reference numerals as in FIG. 1, but with the prefix "1" are used to identify similar elements.

The integrated circuit package 11 differs from the integrated circuit package 1 in that the die pad 12d of the package 11 is provided with a protrusion 18. The protrusion 18 projects from the rear side 12f of the die pad 12d. The enclosure 17 has an external peripheral surface portion 17a which confronts and is spaced from the rear side 12f of the die pad 12d, and the protrusion 18 extends from the rear side 12f of the die pad 12d to the external peripheral surface portion 17a. The protrusion 18, which is centered with respect to the die pad 12d, constitutes a bent out segment of, or a dimple on, the die pad 12d.

The method of making the integrated circuit package 11 of the invention includes all of the steps outlined above for the integrated circuit package 1 of the prior art. However, the method of making the integrated circuit package 11 includes the additional step of forming the protrusion 18 on the die pad 12d. As illustrated, the adhesive 15 which bonds the chip 14 to the die pad 12d can fill the concavity defined by the protrusion 18.

When the die pad 12d is placed in a mold for encapsulation and begins to move towards the internal mold surface confronting the rear side 12f of the die pad 12d, the tip of the protrusion 18 comes into contact with such surface thereby preventing further movement of the die pad 12d towards the confronting mold surface. The protrusion 18 acts as a spacer which maintains the rear side 12f of the die pad 12d at a predetermined distance from the internal mold surface confronting the rear side 12f. The protrusion 18 additionally acts as a stop which prevents the die pad 12d from shifting to such an extent that the leadframe strip 12 is deformed.

The protrusion 18 makes it possible, with little or no risk of damage, to control precisely the thickness of the layer of epoxy adjacent the die pad 12d. Moreover, the protrusion 18 has no adverse effects on sealing because it is sufficiently removed from the chip 14 and wires 16. The protrusion 18 also allows high yields to be achieved for the expensive integrated circuit packages.

While the invention has been particularly shown and described with reference to the preferred embodiments thereof, it will be understood by those skilled in the art that changes in form and details may be made therein without departing from the spirit and scope of the invention.

What is claimed is:

1. An integrated circuit package comprising, in combination:

a one-piece, self-supporting substrate having a mounting location, said mounting location having a first side and a second side facing away from said first side;

an integrated circuit chip secured to said first side of said mounting location, said mounting location being provided with a pointed protrusion which projects from said second side;

a plastic enclosure for said mounting location and said chip, said plastic enclosure having an external peripheral surface, said second side is spaced from said peripheral surface, said pointed protrusion extending from said second side into contact with said peripheral surface of said plastic enclosure, wherein the point of said pointed protrusion lies in a same plane as said external peripheral surface; and said substrate has a first portion which is in a plane and a second portion which is bent out of said plane and includes said mounting location, said first side of said mounting location spaced from said plane, said protrusion is substantially centered with respect to said mounting location.

2. The package of claim 1 wherein said protrusion comprises a dimple in said substrate.

3. The package of claim 1 wherein said enclosure comprises an epoxy.

\* \* \* \* \*